United States Patent
Hunze et al.

(10) Patent No.: US 8,294,161 B2
(45) Date of Patent: Oct. 23, 2012

(54) RADIATION EMITTING DEVICE

(75) Inventors: Arvid Hunze, Kleinblittersdorf (DE); Ralf Krause, Erlangen (DE); Chien-Shu Chiu, Taipei (TW); Frank Steinbacher, Nürnberg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/081,634

(22) Filed: Apr. 7, 2011

(65) Prior Publication Data

US 2012/0037888 A1 Feb. 16, 2012

Related U.S. Application Data

(63) Continuation of application No. PCT/IB2009/008047, filed on Oct. 6, 2009.

(30) Foreign Application Priority Data

Oct. 7, 2008 (DE) .......... 10 2008 050 331
Dec. 18, 2008 (DE) .......... 10 2008 063 589

(51) Int. Cl.
*H01L 27/15* (2006.01)
(52) U.S. Cl. .......... 257/79; 257/40
(58) Field of Classification Search .......... 257/40, 257/79
See application file for complete search history.

(56) References Cited

U.S. PATENT DOCUMENTS

| | | |
|---|---|---|
| 2004/0104394 A1 | 6/2004 | Lin et al. |
| 2004/0137267 A1 | 7/2004 | Igarashi et al. |
| 2004/0155238 A1 | 8/2004 | Thompson et al. |
| 2005/0074630 A1 | 4/2005 | Kanno et al. |
| 2006/0232194 A1 | 10/2006 | Tung et al. |
| 2007/0236136 A1 | 10/2007 | Jou et al. |
| 2008/0103308 A1 | 5/2008 | Ragini et al. |

FOREIGN PATENT DOCUMENTS

| | | |
|---|---|---|
| DE | 10 2006 010 915 | 9/2007 |
| WO | WO 2010/028262 | 3/2010 |

OTHER PUBLICATIONS

C. Shildknecht et al., "Organic Light Emitting Materials and Devices XI", Edited by Z.H. Kafafi, F. So; Proceedings of the SPIE, vol. 6655, pp. 665502, 2007.
C. Gang et al., "Improved efficiency for white organic light-emitting devices based on phosphor sensitized fluorescence", Applied Physics Letters, vol. 88, No. 8, pp. 83512-08512, 2006.
J.I. Lee et al., "White light emitting electrophosphorescent devices with solution processed emission layer", Japanese Journal of Applied Physics, vol. 45, No. 12, pp. 9231-9233, 2006.

(Continued)

*Primary Examiner* — Douglas Menz
(74) *Attorney, Agent, or Firm* — Cozen O'Connor

(57) ABSTRACT

A radiation-emitting device comprising a substrate, a first electrode and a second electrode, and an emitter layer arranged between the first and second electrode. The emitter layer here comprises a matrix material, 0.5-5% by weight of a radiation emitting emitter and 5-30% by weight of a phosphorescent exciton scavenger. The proportion by weight of the exciton scavenger here is higher than that of the radiation emitting emitter, and the emission maximum of the exciton scavenger is at a shorter wavelength than that of the radiation emitting emitter. In addition, the radiation-emitting device is characterized in that the current efficiency of the emitter layer is increased by at least 10% compared to the current efficiency of an emitter layer without exciton scavenger.

15 Claims, 7 Drawing Sheets

OTHER PUBLICATIONS

Z. Yingfang et al., "White organic light-emitting devices based on 4,4'-bis (2, 2'-diphenylvinyl)-1,1'-biphenyl and phosphorescence sensitized 5,6,11, 12-tetraphenylnaphthacene", Applied Physics Letters, vol. 86, No. 1, pp. 11112-011112.

Kanno et al., "White Stacked Electrophosphorescent Organic Light-Emitting Devices Employing MoO3 as a Charge-Generation Layer", Adv. Mater 2006, 18, pp. 339-342, 2006.

R. Meerheim et al., "Influence of charge balance and exciton distribution on efficiency and lifetime of phosphorescent organic light-emittind devices", Journal of Applied Physics 104, 2008.

Baldo et al, "Transient analysis of organic electrophosphorecence. II. Transient analysis of triplet-triplet annihilation", Physical Review B, vol. 62, No. 16, 2000.

D'Andrade et al., "Efficient Organic Electrophosphorescent White-Light Emitting Device with a Triple Doped Emissive Layer", Adv. Mater 2004, vol. 16, No. 7, pp. 624-628, 2007.

Kawamura et al., "100% phosphorescence quantum efficiency of Ir (III) complexes in organic semiconductor films", Appl. Physics Letters, 86, 071104, 2005.

Parshin et al., "Charge Carrier mobility in CBP films doped with IR (ppy)", Proc. of SPIE, vol. 6192, 61922A-4.

Baldo et al., Very high-efficiency green organic light-emitting devices based on electrophosphorescenc, Applied Physics Letters, vol. 75, No. 1, Jul. 5, 1999, pp. 4-6.

Reineke et al., Triplet-exciton quenching in organic phosphorescent light-emitting diodes with Ir-based emitters, Physical Review B 75, 125328 (2007), pp. 1-13.

A1 = 1060; t1 = 1,181 μs
A2 = 297 ; t2 = 0,328 μs

A1 = 1137; t1 = 1,378 μs
A2 = 227; t2 = 0,18 μs

A1=1065; t1=0,4114 μs
A2=1170; t2=0,1218 μs

A1=427; t1=1,253 μs
A2=347; t2=0,205 μs

RADIATION EMITTING DEVICE

RELATED APPLICATIONS

This is a continuation of International Application No. PCT/IB2009/008047, filed on Oct. 6, 2009, which claims priority from German Patent Application No. 10 2008 050 331.2, filed on Oct. 7, 2008 and 10 2008 598.8, filed Dec. 18, 2008, the contents of both of which are hereby incorporated by reference.

FIELD OF THE INVENTION

The present invention relates to a radiation-emitting device with an emitter layer which comprises a matrix material, a radiation emitting emitter and a phosphorescent exciton scavenger.

BACKGROUND OF THE INVENTION

High-efficiency phosphorescent emitters are one of the prerequisites for the development of high-efficiency organic light-emitting diodes (OLEDs), and for display and lighting applications. Crucial factors for this are firstly the quantum efficiency of the individual emitter molecule and secondly that of the emitter overall, the current efficiency and the power efficiency of the system (which means the light output per unit electrical output).

SUMMARY OF THE INVENTION

It is an object of the invention to provide a radiation-emitting device with improved efficiency.

The radiation-emitting device according to an embodiment of the invention comprises a substrate, a first electrode and a second electrode, and an emitter layer arranged between the first and second electrodes. This emitter layer has a matrix material which comprises 0.5-5% by weight of a radiation emitting emitter and 5-30% by weight of an exciton scavenger, especially of a phosphorescent exciton scavenger. The proportion by weight of the exciton scavenger here is higher than that of the radiation emitting emitter. In addition, the emission maximum of the phosphorescent exciton scavenger is at a shorter wavelength than the emission maximum of the radiation emitting emitter. The current efficiency of the emitter layer of the radiation-emitting device is increased, especially increased by at least 10%, compared to the current efficiency of an emitter layer which does not comprise an exciton scavenger.

By virtue of the emitter layer according to an embodiment of the invention, which comprises, in addition to matrix material and radiation emitting emitter, also a phosphorescent exciton scavenger, it is possible to increase the current efficiency of the emitter layer compared to an emitter layer without exciton scavenger. This is because the conductive properties of the dopant lead to a better charge carrier equilibrium and to a lower voltage; in addition to an increased quantum efficiency, this leads to an improvement in the power efficiency. The better charge carrier equilibrium is attributable to the fact that the matrix transports the majority charge carriers and the exciton scavenger the minority charge carriers (for example, in the case of a hole-transporting matrix, the electrons are transported via the LUMO of the exciton scavenger). The addition of the exciton scavengers therefore also enables the use of emitter materials which possess highest photoluminescence efficiencies merely in low concentrations and thus have, for example, good long-term stability, i.e. are an option for use for high-efficiency OLEDs. These substances—when they are not in a mixture with the exciton scavenger—are less suitable since the few emitter molecules present in the matrix material then act as trap sites, which means that the charge carrier mobility is reduced (since the charge carriers are "trapped" at the trap sites). The result of this is that the operating voltage is increased.

The low concentration of emitter materials can also prevent stacking of the molecules, especially in the case of emitters without steric hindrance at high concentrations, which can result in a red shift of the emitted spectrum. In contrast, the high concentrations of the exciton scavenger have the effect, in addition to the above effects that these exciton scavengers do not act as trap sites for the charge carriers, but that good transport of the charge carriers can take place.

The emitter layers present in the radiation-emitting devices according to an embodiment of the invention thus have an increased current efficiency (compared to emitter layers without the inventive exciton scavengers), which is typically increased by at least 10% (especially at luminances of 10 to 1100 $cd/m^2$). Frequently, the current efficiency is even 20% and in some cases even 25% above the current efficiency of a corresponding emitter layer without the inventive exciton scavenger (especially at luminances of 10 to 1100 $cd/m^2$). This applies especially to current efficiencies at high light intensities, i.e. light intensities typically greater than 1000 $cd/m^2$.

The individual components of the radiation-emitting device according to embodiments of the present invention are explained in detail hereinafter:

A "substrate" comprises, according to the present invention, for example, a substrate as conventionally used in the prior art for a radiation-emitting device.

For example, the substrate may comprise glass, quartz, plastic films, metal, metal foils, silicon wafers or another suitable substrate material. When the radiation-emitting device is configured, for example, as a "bottom emitter", the substrate is preferably transparent and is formed, for example, as a glass substrate.

In the radiation-emitting device according to an embodiment of the invention, the first electrode may have been deposited on the substrate.

The "first electrode", as used herein, may firstly be an anode. The anode may consist of a hole-injecting material. The hole-injecting material used may be any hole-injecting material known in the prior art. When the radiation-emitting device is configured, for example, as a "bottom emitter", the anode typically consists of a transparent material. For example, it may consist of transparent conductive oxides or comprise a layer thereof. These transparent conductive oxides ("TCOs") include metal oxides, for example zinc oxide, tin oxide, cadmium oxide, titanium oxide, indium oxide or indium tin oxide (ITO), $Zn_2SnO_4$, $CdSnO_3$, $ZnSnO_3$, $MgIn_2O_4$, $GaInO_3$, $Zn_2In_2O_3$ or $In_4Sn_3O_{12}$, or mixtures of different transparent conductive oxides, but are not limited thereto. The TCOs are not necessarily subject to a stoichiometric composition and may additionally also be p- or n-doped.

When the first electrode is an anode, the second electrode is a cathode. The "cathode" may consist of an electron-injecting material. The cathode materials used may be cathode materials customary in the art, especially aluminum, barium, indium, silver, gold, magnesium, calcium or lithium, and compounds and alloys of these substances, and mixtures of the aforementioned elements, compounds and/or alloys. Alternatively or additionally, it is also possible for one or more of the TCOs mentioned for the anode materials to be present, or else for the cathodes to consist entirely of one of these materials. The cathode may thus also be transparent.

In the radiation-emitting device, it is possible, for example, for one electrode to be transparent and the other to be reflective. The radiation-emitting device can thus be configured either as a "bottom emitter" or as a "top emitter". Alternatively, both electrodes may also be transparent.

The emitter layer of the inventive radiation-emitting device refers to a functional layer of a matrix material which comprises one or more radiation emitting emitters and one or more phosphorescent exciton scavengers, or consists of the matrix material, the at least one emitter and the at least one exciton scavenger.

The emitter and the exciton scavenger may be embedded here into a matrix material selected from the group consisting of mCP (1,3-bis(carbazol-9-yl)benzene), TCP (1,3,5-tris(carbazol)-9-yl)benzene), TCTA (4,4',4"-tris(carbazol-9-yl) triphenylamine), TPBi (1,3,5-tris(1-phenyl-1H-benzimidazol-2-yl)benzene), CBP (4,4'-bis(carbazol-9-yl)biphenyl), CDBP (4,4'-bis(9-carbazolyl)-2,2'-dimethylbiphenyl), DMFL-CBP (4,4'-bis(carbazol-9-yl)-9,9-dimethylfluorene), FL-4CBP (4,4'-bis(carbazol-9-yl)-9,9-bis(9-phenyl-9H-carbazol)fluorene), DPFL-CBP (4,4'-bis(carbazol-9-yl)-9,9-ditolylfluorene), FL-2CBP (9,9-bis(9-phenyl-9H-carbazole) fluorene), spiro-CBP (2,2',7,7'-tetrakis(carbazol-9-yl)-9,9'-spirobifluorene), ADN (9,10-di(naphth-2-yl)anthracene), TBADN (3-tert-butyl-9,10-di(naphth-2-yl)anthracene), DPVBi (4,4'-bis(2,2-diphenylethen-1-yl)-4,4'-dimethylphenyl), p-DMDPVBi (4,4'-bis(2,2-diphenylethen-1-yl)-4,4'-dimethylphenyl), TDAF (tert(9,9-diarylfluorene)), BSBF (2-(9,9'-spirobifluoren-2-yl)-9,9'-spirobifluorene), TSBF (2,7-bis(9,9'-spirobifluoren-2-yl)-9,9'-spirobifluorene), BDAF (bis(9,9-diarylfluorene)), p-TDPVBi (4,4'-bis(2,2-diphenylethen-1-yl)-4,4'-di(tert-butyl)phenyl), TPB3 (1,3,5-tri (pyren-1-yl)benzene), and mixtures of the aforementioned substances. Preferred matrix materials are the materials TCTA, TPBi, CBP, CDBP and CPF. The matrix materials present in mixed systems are preferably mixtures of one or more of the materials TCTA, mCP, CBP, CDBP or CPF with one another, or mixtures with TPBi.

The emitter material may have, for example, an emission maximum in the blue, green or red spectral range. When such an emitter material has several emission maxima, the emission maximum in the context of this invention is considered to be the emission maximum with the greatest intensity.

If there exist two or more highest-intensity emission maxima at different wavelengths for different current densities, the maximum at the smaller wavelength is the emission maximum among these emission maxima in the context of this invention (especially for the determination of the difference of the wavelengths of the emission maximum of the radiation emitting emitter and of the emission maximum of the exciton scavenger).

A blue-phosphorescent emitter material may be selected from the group consisting of FIrPic (bis(3,5-difluoro-2-(2-pyridyl)phenyl-(2-carboxypyridyl)iridium(III)), FIr6 (bis (48,68-difluorophenylpyridinato)tetrakis(1-pyrazolyl)borate-iridium(III), and of mixtures of the aforementioned substances. The emitter materials mentioned have their emission maxima in the blue spectral range.

Green-phosphorescent emitter material may be selected from the group consisting of Ir(ppy)$_3$ (tris(2-phenylpyridine) iridium(III)), Ir(ppy)$_2$(acac)(bis(2-phenyl-pyridine)(acetylacetonate)iridium(II)), iridium(III)tris(2-(4-tolyl)pyridinato-N,C2), tris(2-phenylpyridine)iridium(III), tris(8-hydroxyquindato)aluminum(III), tris(2-methyl-8-hydroxyquinolato)aluminum(III), tris(8-hydroxyquinolato) gallium(III), tris(3-methyl-1-phenyl-4-trimethylacetyl-5-pyrazoline)terbium(III), and from mixtures of the aforementioned substances. The emitter materials mentioned have their emission maxima in the green spectral range.

The red-phosphorescent emitter material used may be an emitter material selected from the group consisting of Ir(mdq)$_2$(acac)(bis(2-methyl-dibenzo[f,h]-quinoxaline) (acetylacetonate)iridium(III)), Eu(dbm)$_3$(phen)(tris-(dibenzoylmethane)phenanthroline-europium(III)), Ir(btp)$_2$(acac) (bis(2-benzo[b]thiophen-2-yl-pyridine)(acetylacetonate) iridium(III)), Ir(piq)$_2$(acac)(bis(1-phenylisoquinoline) (acetylacetonate)iridium(III)), Ir(flq)$_2$(acac)-1(bis[1-(9,9-dimethyl-9H-fluoren-2-yl)-isoquinoline](acetylacetonate) iridium(III)), Ir(flq)$_2$(acac)-2(bis[3-(9,9-dimethyl-9H-fluoren-2-yl)isoquinoline](acetylacetonate)iridium(III)), Ru(dtb-bpy)$_3$*2(PF$_6$)(tris[4,4'-di-tert-butyl-(2,2')-bipyridine]ruthenium(III)complex), Ir(2-phq)$_3$(tris(2-phenylquinoline)iridium(III)), Ir(2-phq)$_2$(acac)(bis(2-phenylquinoline)(acetylacetonate)iridium(III), Ir(piq)$_3$(tris(1-phenylisoquinoline)iridium(III)), iridium(III)-bis(2-(2'-benzothienyl)pyridinato-N,C3')-(acetylacetonate), tris (dibenzoylacetonato)mono(phenanthroline)europium(III), tris(dibenzoylmethane)mono(phenanthroline)europium(III), tris(dibenzoylmethane)mono(5-aminophenanthroline)europium(III), tris(dinaphthoylmethane)mono(phenanthroline) europium(III), tris(4-bromobenzoylmethane)-mono(phenanthroline)europium(III), tris(dibiphenoylmethane)mono (phenanthroline)europium(III), tris(dibenzoylmethane) mono(4,7-dimethylphenanthroline)europium(III), tris (dibenzoylmethane)mono(4,7-dimethylphenanthrolinedisulfonic acid)europium(III) disodium salt, tris[di(4-(2-(2-thoxyethoxy)ethoxy) benzoylmethane)]mono(phenanthroline)europium(III), tris [di(4-(2-(2-thoxyethoxy)ethoxy)benzoylmethane)]mono(5-aminophenanthroline)europium(III), and from mixtures of the aforementioned substances. The emitter materials mentioned have their emission maxima in the red spectral range.

In addition, the emitter materials used may also be fluorescent emitters.

The blue-fluorescent emitter used may be a compound selected from the group consisting of BCzVBiI (4,4'-bis(9-ethyl-3-carbazovinylene)-1,1'-biphenyl), perylene, TBPe (2,5,8,11-tetra-tert-butylperylene), BCzVB (9H-carbazole-3,3'-(1,4-phenylene-di-2,1-ethenediyl)bis[9-ethyl-(9C)]), DPAVBi (4,4-bis[4-(di-p-tolyl-amino)styryl]biphenyl), DPAVB (4-(di-p-tolylamino)-4'-[(di-p-tolylamino)styryl] stilbene), BDAVBi (4,4'-bis[4-(diphenylamino)styryl]biphenyl, BNP3FL (N,N'-bis(naphthalen-2-yl)-N,N'-bis(phenyl) tris(9,9-dimethylfluorenylene), 9,10-bis[(9-ethyl-3-carbazolyl)vinylenyl]-anthracene, 4,4'-bis (diphenylvinylenyl)biphenyl, 1,4-bis(9-ethyl-3-carbazovinylene)-2-methoxy-5-(2-thylhexyloxy)benzene, 4,4'-bis(diphenylvinylenyl)anthracene, 1,4-bis(9-ethyl-3-carbazovinylene)-9,9-dihexylfluorene, and from mixtures of the aforementioned substances. The emitter materials mentioned have their emission maxima in the blue spectral region. In addition, it is also possible to use red- or green-fluorescent emitter materials.

The emitter layer in an embodiment of the inventive radiation-emitting device has, in addition to the radiation-emitter, also a phosphorescent exciton scavenger.

The phosphorescent exciton scavenger is a compound to which efficient energy transfer from the matrix material is possible. In operation, excitons are therefore transferred at first from the matrix material to the exciton scavenger, or are formed directly on the latter. The exciton scavenger then has the task of ensuring efficient and rapid energy transfer to the emitter material, i.e. of transferring excitons to this emitter material.

The phosphorescent exciton scavenger also enables good transport of the minority charge carriers in a matrix in which the majority charge carriers with opposite charge are being transported (in the case of a hole-transporting host material, the exciton scavengers thus enable good electron transport).

Even though the exciton scavenger is a phosphorescent compound, it is thus unimportant that the exciton scavenger emits radiation; instead, it is essential that the exciton scavenger ensures good transport both of the charge carriers and of the excitons. The materials used as exciton scavengers always differ from the materials used as emitters.

Suitable exciton scavengers are very substantially the same compounds as for the aforementioned phosphorescent emitter materials, provided that the emission maximum of the phosphorescent exciton scavenger is at a shorter wavelength than the emission maximum of the radiation emitting emitter.

In one embodiment, the proportion of the exciton scavenger is 10-20% by weight (in the context of the present invention, all figures in % by weight always relate to the matrix material present in the emitter layer). From a proportion by weight of at least 10% by weight, a sufficient amount of exciton scavenger is present in the matrix material that very efficient transport of the charge carriers is enabled, and therefore a distinct rise in the current efficiency is recorded. From a proportion of 20% by weight, it is possible under some circumstances that interactions of two excitons can result in efficiency losses.

In a further embodiment, the proportion of the radiation emitting emitter is 1-4% by weight. From a portion by weight of 5% by weight, concentration quenching and hence a distinct lowering in efficiency are to be expected.

In further embodiments, the proportion by weight of the exciton scavenger is at least four times, frequently even eight times, as high as that of the radiation-emitting emitter material.

In a further embodiment, either the HOMO of the exciton scavenger is such that—provided that the matrix material is a material which better transports electrons—injection of the holes (i.e. a transfer of holes from the layer which follows on the anode side of the emitter layer to the exciton scavenger) is facilitated, or the LUMO of the exciton scavenger is such that—provided that the matrix material is a material which transports holes better—injection of electrons (from the layer which follows on the cathode side of the emitter layer to the exciton scavenger) is facilitated. More particularly, the LUMO of the exciton scavenger in the case of a matrix material which transports holes better is up to 0.3 electron volt above or below the LUMO of the layer following the emitter layer on the cathode side. The LUMO is preferably 0-0.3 electron volt below this energy level. In the case of matrix materials which conduct electrons better, the HOMO of the exciton scavenger is preferably up to 0.3 electron volt below or above the HOMO of the layer which follows on the anode side of the emitter layer. Particular preference is given to a HOMO which is 0-0.3 electron volt below the HOMO of this layer. HOMO here stands for "Highest Occupied Molecular Orbital", and LUMO for "Lowest Unoccupied Molecular Orbital".

For example, there may be an electron transport layer which follows on the cathode side of the emitter layer; for example, there may be a hole transport layer which follows on the anode side of the emitter layer.

In a further embodiment, the difference in the wavelengths of the emission maximum of the radiation emitting emitter and of the emission maximum of the exciton scavenger is at least 15 nm, typically even at least 30 nm. Typically, for emitter materials which emit in the yellow, orange or red spectral region, an exciton scavenger which has an emission maximum in the blue or green spectral region is used; for green-emitting materials an exciton scavenger which has an emission maximum in the blue spectral region is used, and for blue-emitting materials an exciton scavenger which has the emission maximum in the violet or ultraviolet spectral region. Especially in the case of blue-emitting materials, the difference in the wavelengths of emission maxima is not more than 100 nm. According to the invention, the red, orange, yellow, green, blue and violet spectral regions are generally the following ranges: red spectral region about 640 to 780 nm; orange spectral region about 600 to 640 nm, yellow spectral region about 570 to 600 nm, green spectral region about 500 to 570 nm, blue spectral region about 430 to 500 nm, violet spectral region about 380 to 430 nm.

In a further embodiment, the radiation emitted by the emitter layer of the radiation-emitting device according to the invention is produced essentially by the radiation emitting emitter. Due to the very good charge carriers and exciton conductivity of the exciton scavenger, the excitons formed in matrix material or on the exciton scavenger are essentially transferred to the emitter material, such that the light emitted by the emitter layer causes essentially the same colour impression as the light which is emitted by an emitter layer without exciton scavenger. "Essentially the same color impression" is understood here to mean that the CIE coordinates of the emitted light of an emitter layer without exciton scavenger ($x_{oE}$, $y_{oE}$) do not differ significantly from those of an emitter layer comprising exciton scavenger ($x_{mE}$, $y_{mE}$). In general, for the difference, $\Delta x = x_{oE} - x_{mE}$ or the difference $\Delta y = y_{oE} - y_{mE}$, $\Delta x < 0.05$ and/or $\Delta y < 0.05$. Frequently, it is even the case that $\Delta x < 0.03$ and/or $\Delta y < 0.03$ and in many cases also $\Delta x < 0.01$ and $\Delta y < 0.01$. For the sum of the absolute magnitudes of these differences $\Sigma_A = |\Delta x| + |\Delta y|$, in general, $\Sigma_A < 0.08$, frequently $\Sigma_A < 0.05$ and in many cases $\Sigma_A < 0.01$.

In many cases, it is evident even from the normalized emission spectrum that the excitons are transferred from the exciton scavenger essentially to the radiation emitting emitter. This is because, typically, the intensity of the normalized emission of the emission maximum of the exciton scavenger in a spectrum measured for the emitter layer comprising exciton scavenger and radiation emitting emitter is not more than 10% of the intensity of the emission maximum of the radiation emitting emitter. Usually, the intensity of the emission maximum of the exciton scavenger is even only a maximum of 5%, frequently only a maximum of 1%, of the intensity of the emission maximum of the radiation emitting emitter. The intensity ratios measured are typically independent of the current density, especially at current densities between 0.5 and 10 mA/cm².

Typically, it is additionally the case that the intensity of the emission maximum of the exciton scavenger in an emitter layer comprising exciton scavenger and radiation emitting emitter is also reduced significantly compared to the intensity of the emission maximum of an emitter layer which comprises only the exciton scavenger (in the same concentration as in the aforementioned "mixed" system) and no radiation-emitting emitter material. Typically, the intensity (measured at the same current density of, for example, 5 mA/cm²) of the normalized emission of the emission maximum of the exciton scavenger in the emitter layer comprising emitter and exciton scavenger is then not more than 10%, usually not more than 5% and frequently even not more than 1% of the normalized emission of the emission maximum of the exciton scavenger in a layer which consists only of the matrix material and the exciton scavenger. As described above, this is attributable essentially to the good exciton conductivity of the exciton scavenger.

The good exciton conductivity can also be determined by the time-resolved wavelength-dependent emission spectra. If an emitter layer which comprises an exciton scavenger and a radiation-emitting emitter material is compared here to an identical layer which comprises either only the exciton scavenger or only a radiation-emitting emitter material in the same concentrations, it is found that the half-life of the intensity of the emission of the emission maximum of the exciton scavenger in the "mixed system" has been reduced significantly, while the half-life of the intensity of the emission of the emission maximum of the radiation-emitting emitter material remains essentially the same. It is frequently observed that the half-life is reduced by at least half. The half-life is often even only 40% and in many cases even only 33% of the half-life which has been measured for a matrix material in which exclusively the exciton scavenger is present. This effect also means, inter alia, that the lifetime of the excitons on the radiation emitting emitter is generally longer than the lifetime of the excitons on the exciton scavenger. If this lifetime is compared to the lifetimes of matrix materials in which exclusively the exciton scavenger or the radiation-emitting emitter material is present in the same concentration in each case, it is found that exactly the reverse situation may be present in the non-mixed systems, i.e. the lifetime of the excitons on the exciton scavenger may be longer than that of the excitons in the parallel system on the radiation emitting emitter.

The above-described effects generally also lead to the result that the external quantum efficiency of the emitter layer can be increased significantly. If the external quantum efficiency of an emitter layer comprising exciton scavenger and radiation emitting emitter is compared with the quantum efficiency of an emitter layer which comprises only the radiation emitting emitter (in the same concentration) and no exciton scavenger, it is found that the quantum efficiency is usually increased by at least 20%. Frequently, even an increase by 30% can be found. With the emitter layer according to the invention, it is therefore possible to achieve external quantum efficiencies $\eta_{ext}$ greater than 12%, frequently even greater than 14%. It is even possible to achieve quantum efficiencies between above 18%, for example of 20%.

In a further configuration, the radiation emitting emitter present in the emitter layer has a high photoluminescence quantum yield, especially also at low emitter concentrations. In general, this photoluminescence quantum yield $\eta_{PL}$ will be lower than that of the exciton scavenger. In addition, the excitons on the radiation-emitting material also have a relatively short lifetime. In general, this is not more than 20 μs.

In a further configuration, the radiation-emitting emitter material has a LUMO above the LUMO of the exciton scavenger. This leads to the result that the excitons are essentially captured by the exciton scavenger or formed thereon, and the exciton scavenger or the radiation-emitting emitter material can essentially fulfil their intended tasks. In that case, the excitons formed in the matrix material are essentially transferred to the exciton scavenger and not to the radiation-emitting emitter material, which can in turn serve particularly efficiently to emit radiation. However, the invention is not limited thereto; instead, the LUMO of the radiation emitting emitter may also be below that of the exciton scavenger. In addition, the LUMO of the exciton scavenger and optionally also of the radiation emitting emitter may be lower than that of the matrix material. This leads to the result that the excitons are formed to an increased extent on the exciton scavenger and, therefore, the step of transfer of the excitons formed on the matrix to the exciton scavenger is dispensed with.

In a further configuration, the emitter layer of the radiation-emitting device has a layer thickness of 10-40 nm. Emitter layers with lower layer thicknesses are more difficult to process; moreover, from a layer thickness of 10 nm, the number of emitter sites can be optimized and hence adjusted better to the lifetime of the excitons. In the individual case, however, a layer thickness between 5 and 10 nm may also be technically viable. For the production of a white light-emitting radiation-emitting device which comprises several emitter layers, the layer thickness of each individual emitter layer is preferably 10-15 nm.

Typically, the emitter and also the exciton scavenger are distributed randomly through the matrix material. However, concentration gradients may also be present in the emitter layer, such that, for example, regions in which the exciton scavenger is in a higher concentration alternate with regions in which the emitter material is present in a higher relative concentration; it is even also possible for only regions in which exclusively exciton scavenger is present and regions in which exclusively the phosphorescent emitter is present to be present in the emitter layer. This makes it possible to establish, in a controlled manner, zones in which either excitons are formed or zones in which emission is effected.

In a further embodiment, the radiation-emitting device may therefore have at least one further emitter layer, frequently at least two or three emitter layers. In this case, one or more of the further emitter layers—like the first emitter layer—may also comprise an exciton scavenger in addition to the radiation emitting emitter. For these further emitter layers, the remarks made above for the first emitter layer apply correspondingly. In a further embodiment of the present invention, blocking layers are present between two of the emitter layers in each case. When the radiation-emitting device comprises more than two emitter layers, a blocking layer may be present between all emitter layers, or else only between some of the emitter layers. Such a blocking layer may serve to block excitons and be configured such that the thickness thereof is greater than the mean free path length of the excitons formed in the adjacent layer in each case, such that they essentially cannot pass into the second layer. In addition, the blocking layer may alternatively or simultaneously also serve, at least in parts of the layer, to block charge carriers (electrons or holes). Layers or regions of layers which can block charge carriers can be used to control the charge carrier density. A blocking layer for blocking excitons and/or charge carriers may comprise or consist of one or more matrix materials, in which case suitable matrix materials may be selected from the matrix material disclosed above. Alternatively, layers which block electrons may comprise one or more of the materials which follow for hole transport layers, or comprise this/these and one or more matrix materials. In addition, layers which block holes may comprise one or more of the materials which follow for electron transport layers or comprise this/these and one or more matrix materials.

In a further configuration, the radiation-emitting device according to the invention emits white light. This white light can be formed by the overlap of the radiation which is emitted by the first emitter layer and the at least one further emitter layer. Typically, at least three emitter layers (for example emitter layers which each emit in the red, green and blue spectral region) are used for this purpose. However, another conceivable system is one which comprises only two emitter layers (for example a blue- and an orange-emitting layer).

In summary, it can be stated that it has been recognized in accordance with the invention that the combination of a phosphorescent exciton scavenger in high concentration and of an emitter material in low concentration can independently achieve two effects. Firstly, by virtue of this mixed system, in operation, excitons are first transferred from the matrix material to the exciton scavenger or formed on the exciton scavenger. As a result of an efficient and rapid energy transfer, the excitons then arrive at the emitter material, where they can efficiently decompose radiatively. Moreover, the exciton scavenger has outstanding performance properties for the minority charge carriers. Both effects lead overall to a better charge carrier mobility and to a lower voltage, which, in addition to the increased quantum efficiency, contributes to a further improvement in power efficiency. By virtue of the inventive system, it is also possible that there is no need to use a specific optimized matrix/emitter material system, but rather there exists a further parameter which increases the range of usable matrix materials.

The radiation-emitting device may also have further functional layers. Such layers may, for example, be electron transport layers, electron injection layers, hole transport layers and/or hole injection layers. Such layers may serve to further enhance the efficiency of the radiation-emitting device and are formed at one or more suitable sites in the radiation-emitting device. They may include suitable electron transport materials and/or hole transport materials and/or materials suitable for improvement of hole injection.

Examples of electron transport materials include Liq (8-hydroxyquinolinolatolithium), TPBi (2,2',2"-(1,3,5-benzinetriyl)-tris(1-phenyl-1H-benzimidazole), PBD (2-(4-biphenylyl)-5-(4-tert-butylphenyl)), BCP (2,9-dimethyl-4,7-diphenyl-1,10-phenanthroline), BPhen (4,7-diphenyl-1,10-phenanthroline), BAlq (bis-(2-methyl-8-quinolinolate)-4-(phenylphenolato)aluminum) and TAZ (3-(4-biphenylyl)-4-phenyl-5-tert-butylphenyl-1,2,4-triazole), and mixtures of the aforementioned substances. For the electron transport layer (which may at the same time serve as an exciton blocking layer), preference is given to selecting substances from the group consisting of TPBi, BCP, Bphen, CzSi and TAZ, and from mixtures of these substances.

Examples of hole transport materials include NPB (N,N'-bis(naphthalen-1-yl)-N,N'-bis(phenyl)benzidine), β-NPB (N,N'-bis(naphthalen-2-yl)-N,N'-bis(phenyl)benzidine), TPD (N,N'-bis(3-methylphenyl)-N,N'-bis(phenyl)benzidine), spiro-TPD (N,N'-bis(3-methylphenyl)-N,N'-bis(phenyl)benzidine), spiro-NPB (N,N'-bis(naphthalen-1-yl)-N,N'-bis(phenyl)spiro), DMFL-TPD (N,N'-bis(3-methylphenyl)-N,N'-bis(phenyl)-9,9-dimethylfluorene), DMFL-NPB (N,N'-bis(naphthalen-1-yl)-N,N'-bis(phenyl)-9,9-dimethylfluorene), DPFL-TPD (N,N'-bis(3-methylphenyl)-N,N'-bis(phenyl)-9,9-diphenylfluorene), DPFL-NPB (N,N'-bis(naphthalen-1-yl)-N,N'-bis(phenyl)-9,9-diphenylfluorene), Sp-TAD (2,2',7,7'-tetrakis(N,N-diphenylamino)-9,9'-spirobifluorene) and TAPC (di[4-(N,N-ditolylamino)phenyl]cyclohexane) or mixtures of the aforementioned substances. For the hole transport layer (which may likewise serve simultaneously as an exciton blocking layer), preference is given to selecting substances from the group consisting of NPB, TCTA, TPD, Sp-TAD and TAPC, and for mixtures of these substances.

Examples of materials suitable for improving hole injection include CuPC (phthalocyanine, copper complex), TiOPC (titanium oxide phthalocyanine), m-MTDATA (4,4',4"-tris (N-3-methylphenyl-N-phenylamino)triphenylamine), 2T-NATA (4,4',4"-tris(N-(2-naphthyl)-N-phenylamino) triphenylamine), 1T-NATA (4,4',4"-tris(N-(1-naphthyl)-N-phenylamino)triphenylamine), NATA (4,4',4"-tris(N,N-diphenylamino)triphenylamine, and mixtures of the aforementioned substances, wherein the materials specified may optionally be doped.

BRIEF DESCRIPTION OF THE DRAWINGS

The present invention is described hereinafter with reference to examples and figures.

DETAILED DESCRIPTION OF THE DRAWINGS

Figure 1B:
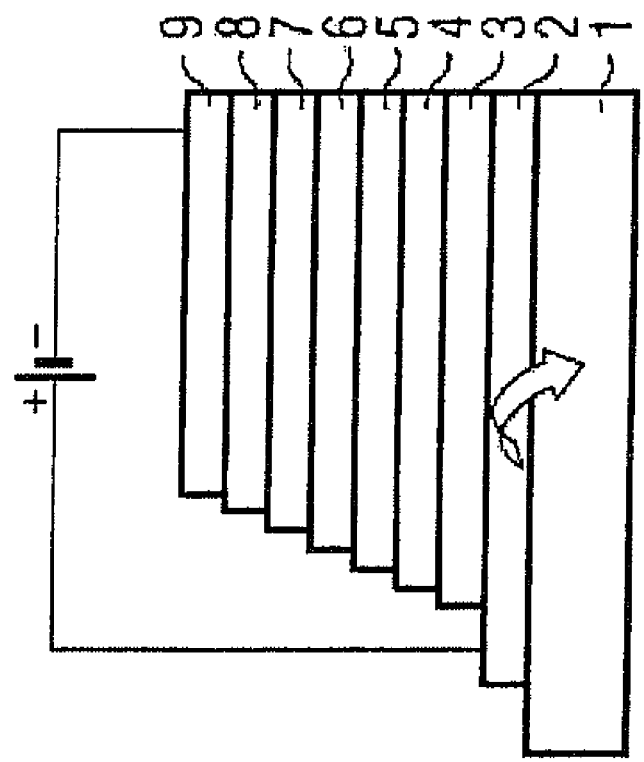
FIGS. 1a and 1b each show a schematic overview of a radiation-emitting device according to embodiments of the present invention.

FIG. 1b shows the schematic layer structure of an organic self-emitting component. From the bottom upward, the following layer structure has been realized: at the bottom is the substrate 1, which may, for example, be transparent and may also be made of glass. Thereon is a lower electrode layer 2, which may, for example, be a transparent conductive oxide such as indium tin oxide (ITO). This lower electrode layer may function as an anode or as a cathode. Above this electrode layer 2 is a hole injection layer 3 above which is in turn arranged a hole transport layer 4. Above the hole transport layer 4 is arranged the organically active layer, the emission layer 5. When the radiation-emitting device comprises more than one emission layer 5, the first emission layer is followed by the further emission layers, which are optionally separated by exciton blocker layers. On the one or more emission layers is the hole-blocking layer 6, on which is arranged the electron transport layer 7 and finally the electron injection layer 8 with adjoining upper electrode 9. The upper electrode 9 may, for example, be a metal electrode or a further transparent electrode, for example composed of one of the aforementioned transparent conductive oxides.

On application of a voltage between upper and lower electrodes, current flows through the component and photons are released in the organically active layer, which leave the component in the form of light via the transparent electrode or via the transparent electrodes.

In the emission layer 5, in accordance with the invention, one or more exciton scavengers and one or more radiation emitting emitters (the latter in a low concentration in each case) are provided in a matrix.

Figure 1A:
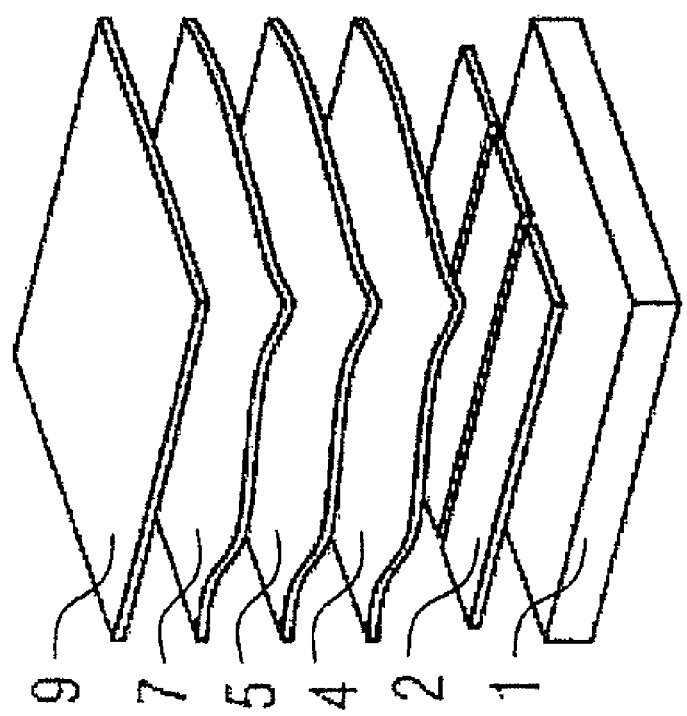

FIG. 1a shows the schematic, 3-dimensional layer structure of an organic self-emitting component according to FIG. 1b. For sake of clearness, not all layers as shown as in FIG. 1b are shown in FIG. 1a. Hole transport layer 4 in FIG. 1a represents exemplary hole injection layer 3 and hole transport layer 4. Electron transport layer 7 in FIG. 1*a* stands for hole blocking layer 6, electron transport layer 7 and electron injection layer 8.

Such a radiation-emitting component can be produced, for example, as follows: by means of HF sputtering, an ITO layer as an anode is first deposited on a glass plate. To deposit the further functional layers, this substrate is introduced into a recipient; this comprises several sources in which organic material (especially for use as an exciton scavenger and for use as a radiation emitting emitter) can be evaporated to produce the individual functional layers of the radiation-emitting device. In addition, one or more sources for the supply of one or more different matrix materials are provided. To form a hole injection layer, from a source comprising matrix material and from a source comprising a p-dopant is deposited together on the glass plate on which the anode is already present. The combined deposition of dopant and matrix material for the hole transport layer is effected correspondingly. This is followed by the combined deposition of a matrix material, which leads to the emitter layer according to the invention. For this purpose, a matrix material, the exciton scavenger and the at least one radiation-emitting emitter material are deposited together. Further layers present, such as blocking layer, electron transport layer and electron injection layer, are deposited analogously. Finally, an aluminum layer is formed as a reflecting electrode.

Alternatively (apart from the electrode layers), the different functional layers can also be applied by means of a wet process (for example spin-coating); this may especially be advisable when the layer to be applied comprises a polymer. In addition, can also the layers applied first by means of a wet process and all layers applied thereto by means of vapor deposition.

Figure 2:
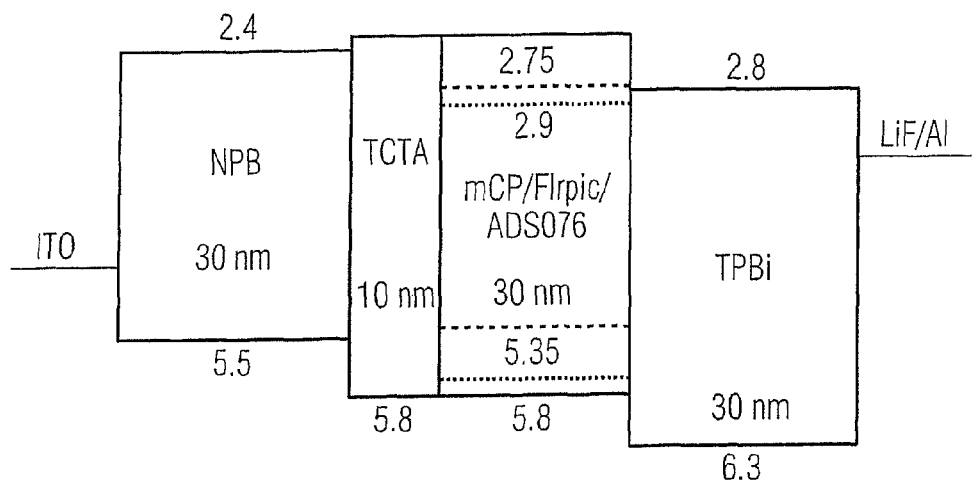
FIG. 2 shows a schematic diagram of the energy levels of one embodiment of an OLED structure according to the present invention.

A working example is specified hereinafter for production of an OLED which emits red light. The schematic structure of this red-emitting OLED is depicted in FIG. 2.

The red light-emitting OLED has a hole transport layer composed of NPB and an electron transport layer composed of TPBi, each of which is 30 nm thick. On the hole transport layer is arranged an exciton blocking layer composed of TCTA, in order to prevent transfer of the excitons from the emission layer to the less efficient hole transport layer. The TPBi arranged on the cathode also functions as a blocking layer for excitons. The emission layer itself consists of the matrix material mCP, into which the red-phosphorescent emitter $Ir(MDQ)_2(acac)$, also known as ADS 076 (energy levels indicated by dots in FIG. 2), are introduced, and the pale blue-phosphorescent exciton scavenger FIrpic (energy levels indicated by squares in FIG. 2). Due to the triplet levels of the molecules, the result of this is that, after the formation of an exciton on the matrix material, it is transferred to the exciton scavenger and, in the case of appropriate concentration, to ADS 076. The exciton scavenger is therefore present, for example, in a concentration of 20% by weight, which leads not only to good direct exciton formation on the dopant but also to very good transfer of excitons formed on the matrix material. In addition, the excitons, due to the high concentration, can diffuse efficiently via the exciton scavenger molecules to the emitter material and be transferred there. Due to the position of the LUMO of the FIrpic exciton scavenger in relation to the LUMO of the electron transport layer, there is also very good electron injection and, due to the good electron conductivity of the exciton scavenger, also very good electron transport. This leads to a distinct improvement in current efficiency.

The HOMO of a material can be determined by means of photoelectron spectroscopy. The band gap, i.e. the energy difference between HOMO and LUMO, can be determined by means of spectroscopy, in which the wavelength of the light emitted is measured and this is used to calculate the excitons formed and the band gap. The energy level of the LUMO is then calculated from the HOMO determined and the band gap.

Figure 3:
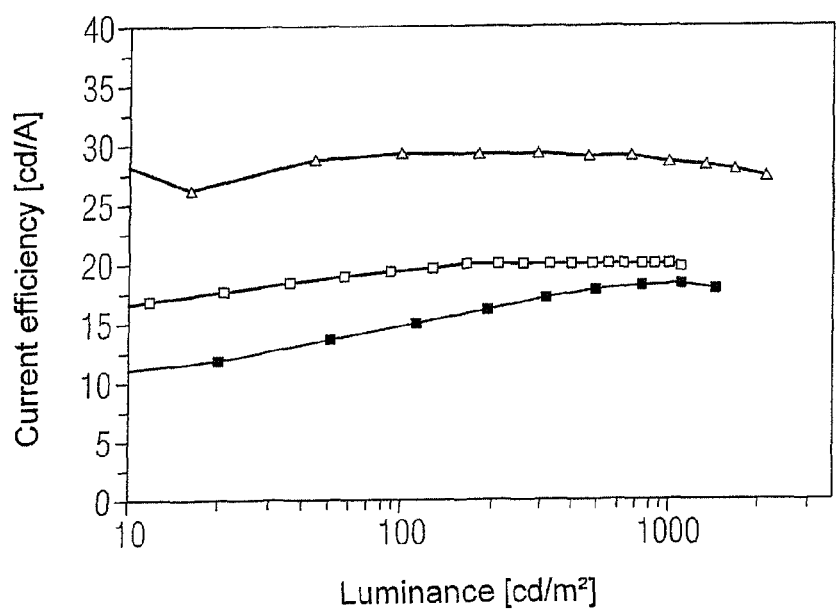
FIG. 3 shows the improved current efficiency of the inventive emitter layer as a function of luminance.

FIG. 3 shows the improved current efficiency of an emitter layer with mCP as a matrix material, 20% by weight of FIrpic and 2% by weight of ADS 076 (upper curve—triangles) compared to a layer which likewise comprises mCP as a matrix material and only 2% by weight of ADS 076 (middle curve—unfilled squares) and mCP with only 20% by weight of FIrpic (lower curve—filled squares).

The following table compares the performance data of the device according to the invention with emitter layers which comprise either only a red emitter ADS 076 or only the exciton scavenger FIrpic report:

| Concentration | Current density [mA/cm$^2$] | Luminance [cd/m$^2$] | Voltage [V] | Current efficiency [cd/A] | Power efficiency [lm/W] | External quantum efficiency [$\eta_{ext}$] |
|---|---|---|---|---|---|---|
| 20% by wt. of FIrpic in mCP | 2.5 | 391 | 5.1 | 17.3 | 10.7 | 6.4% |
| 2% by wt. of ADS 076 in mCP | 2.5 | 475 | 7.5 | 20.3 | 8.5 | 10.2% |
| 20% by wt. of FIrpic + 2% by wt. of ADS 076 in mCP | 2.5 | 654 | 5.5 | 28.9 | 16.5 | 14.7% |

Figure 4:
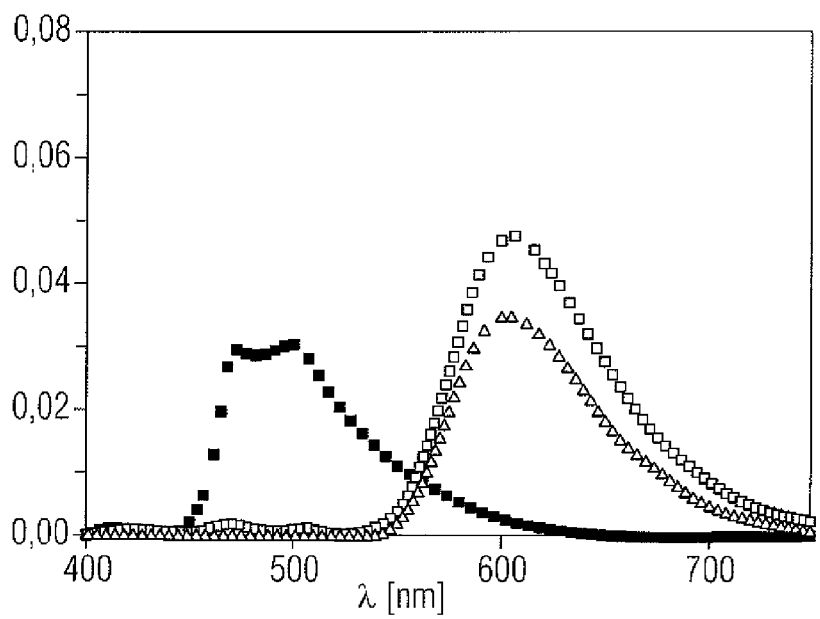
FIG. 4 shows the electroluminescence spectrum for emitter layers with and without exciton scavenger and with and without emitter at a current density of 5 mA/cm$^2$.
Figure 5A:
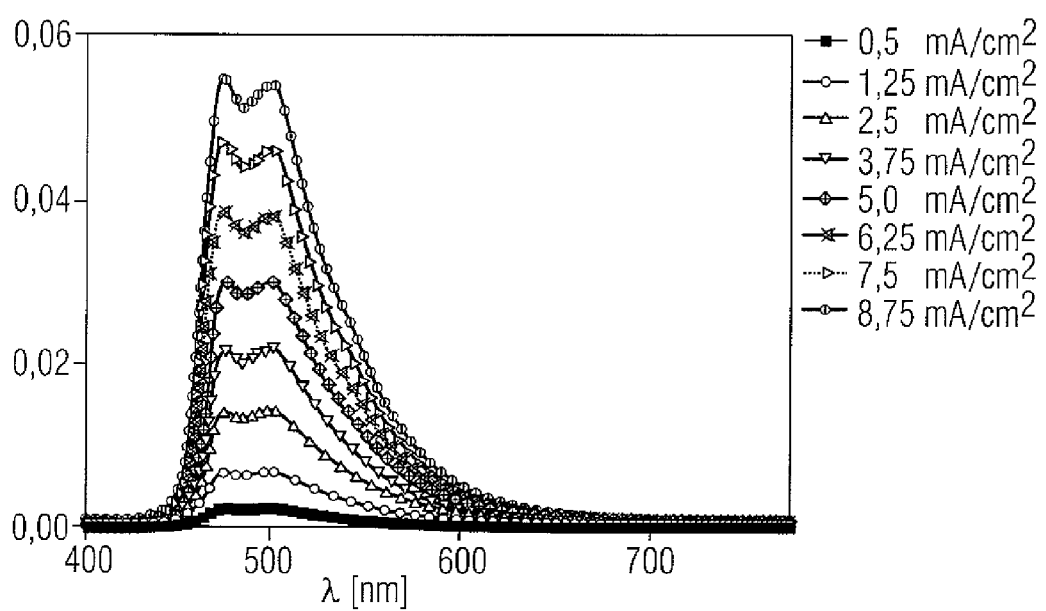
FIGS. 5a to 5c show the electroluminescence spectra for layers with and without exciton scavenger and with and without emitter at different current densities.
Figure 5B:
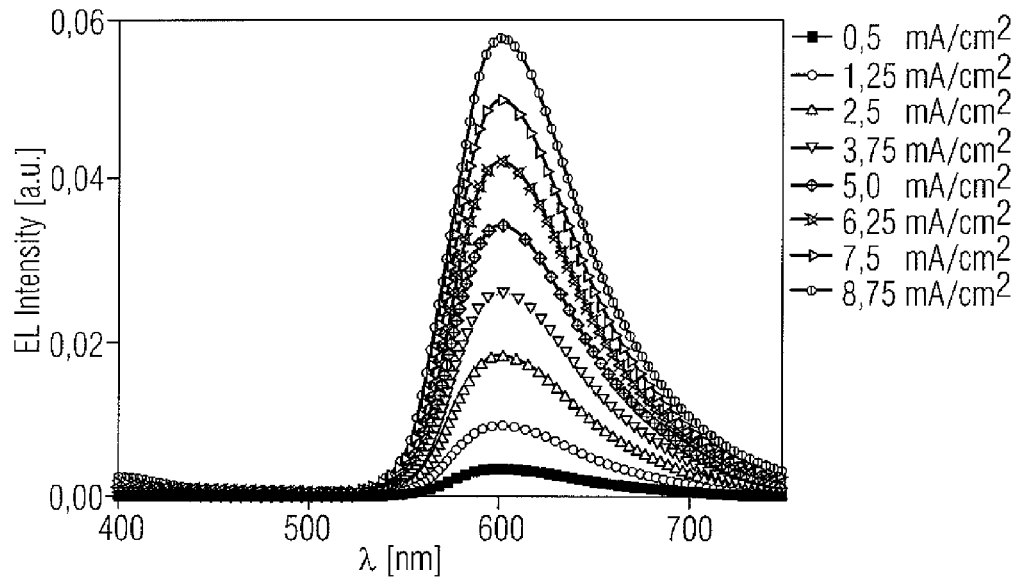
Figure 5C:
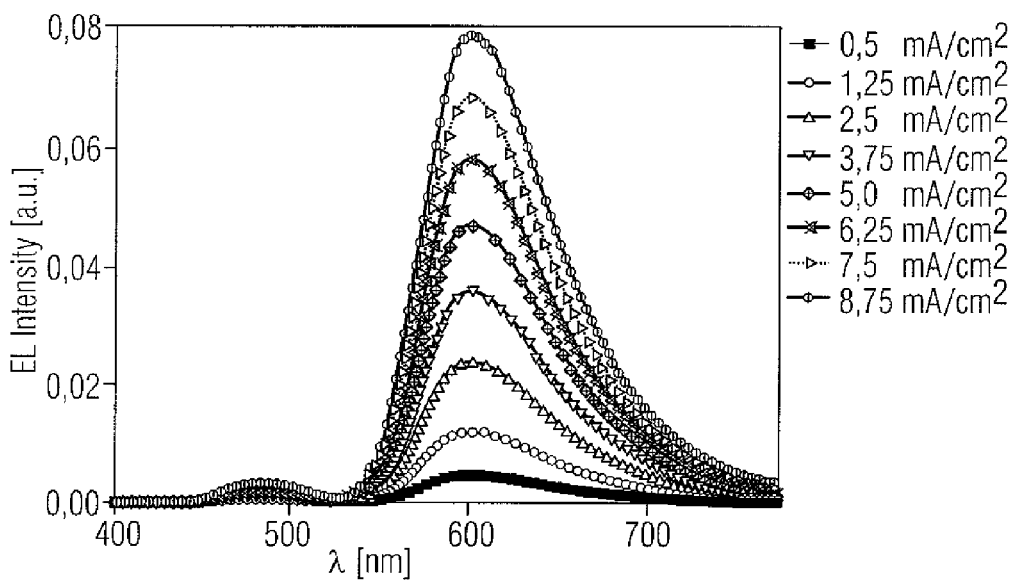

With reference to the electroluminescence spectrum measured at 5 mA/m$^2$ in FIG. 4, it can be seen that addition of 20% by weight of the exciton scavenger FIrpic to 2% of the red emitter ADS 076 results in very good energy transfer from the exciton scavenger to the red emitter. The spectrum (unfilled squares), apart from a small remaining FIrpic peak, is virtually identical to that of the pure layer of mCP containing 2% ADS 076 (triangles). An mCP layer which contains only (20% by weight of) FIrpic, in contrast, exhibits a distinct emission in the blue spectral region (filled squares). This observation is also essentially independent of the current density at which the measurement is made. FIGS. 5*a-c* show the emission spectra for 20% by weight of FIrpic in mCP (FIG. 5*a*), 2% by weight of $Ir(MDQ)_2(acac)$ in mCP (FIG. 5*b*), and 20% by weight of FIrpic and 2% by weight of $Ir(MDQ)_2(acac)$ in mCP (FIG. 5*c*) at current densities of 0.5 mA/cm$^2$ to 8.75 mA/cm$^2$. These and the measurements above and below were obtained with a Photo research PR 650 spectrometer.

The CIE coordinates of the light emitted for an mCP with red emitter $Ir(MDQ)_2(acac)$, and for mCP with red emitter $Ir(MDQ)_2(acac)$ and exciton scavenger FIrpic, essentially unchanged:

| Concentration | Current density [mA/cm²] | CIE coordinate x | CIE coordinate y | External quantum efficiency [$\eta_{ext}$] |
|---|---|---|---|---|
| 20% by wt. of FIrpic in mCP | 2.5 | 0.193 | 0.415 | 6.4% |
| 2% by wt. of Ir(MDQ)₂(acac) in mCP | 2.5 | 0.594 | 0.395 | 10.2% |
| 20% by wt. of FIrpic + 2% by wt. of Ir(MDQ)₂(acac) in mCP | 2.5 | 0.591 | 0.392 | 14.7% |
| 20% by wt. of FIrpic + 5% by wt. of Ir(MDQ)₂(acac) in mCP | 2.5 | 0.623 | 0.375 | 18.1% |

Figure 6:
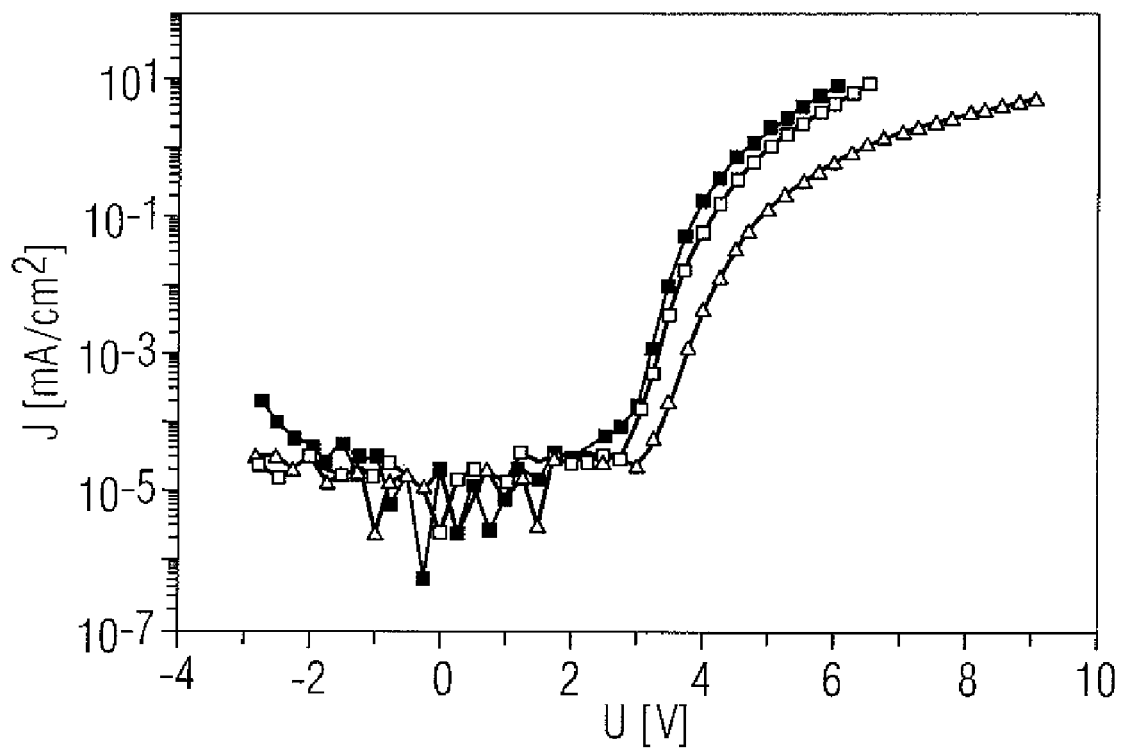
FIG. 6 shows the improvement in the current-voltage characteristic.

In FIG. 6, it can be seen that the addition also causes improved injection and improved transport via the FIrpic molecules, which gives rise to a distinctly steeper current-voltage curve and results in lower operating voltages being required (unfilled squares). These are similarly good to those with 20% by weight of FIrpic without ADS 076 (filled squares), which shows that the electron transport in the mixed layer is improved by the introduction of the exciton scavenger. The cause of the improvement in current efficiency shown in FIG. 3 is that a higher concentration of the FIrpic results in more excitons being formed on the exciton scavenger, which are then transferred to the emitter molecules. Since ADS 076 is present in low concentration and the transport from the FIrpic to the ADS 076 takes place very efficiently and rapidly, the result achieved thereby is that there is good transfer of excitons to the desired emitter with low concentration quenching effects. This therefore gives rise to an increase in the current efficiency.

Figure 7A:
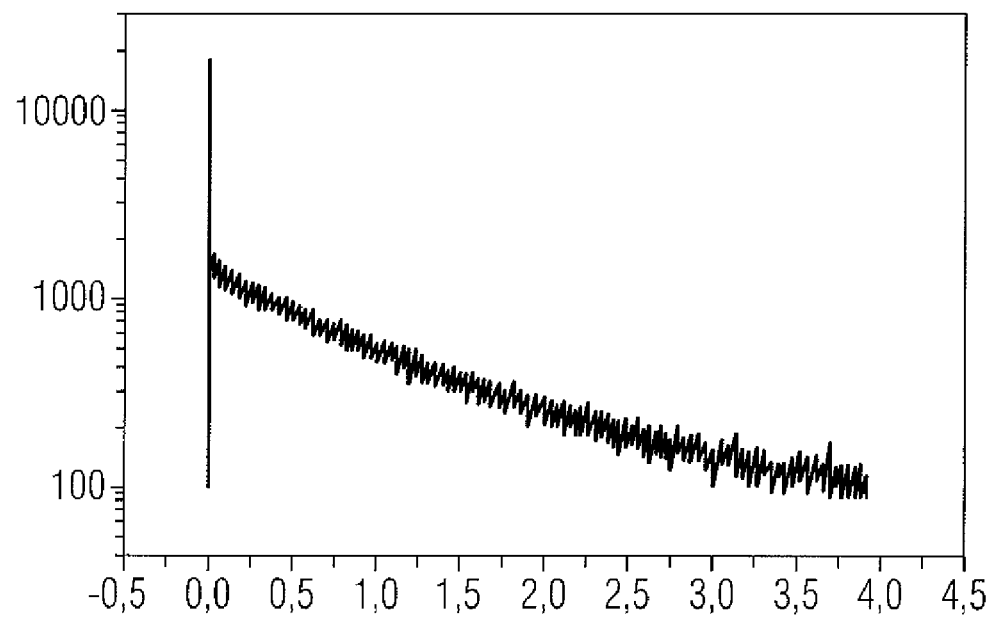
FIGS. 7a to 7d show time- and wavelength-resolved emission spectra.

FIGS. 7a to 7d show the decomposition times of Ir(ppy) and ADS 076 in PMMA as a matrix. FIG. 7a shows the decomposition time of 5% by weight of Ir(ppy)₃. What is being measured here is the emission maximum at 510 nm. A half-life of 1.0 ms is found.

Figure 7B:
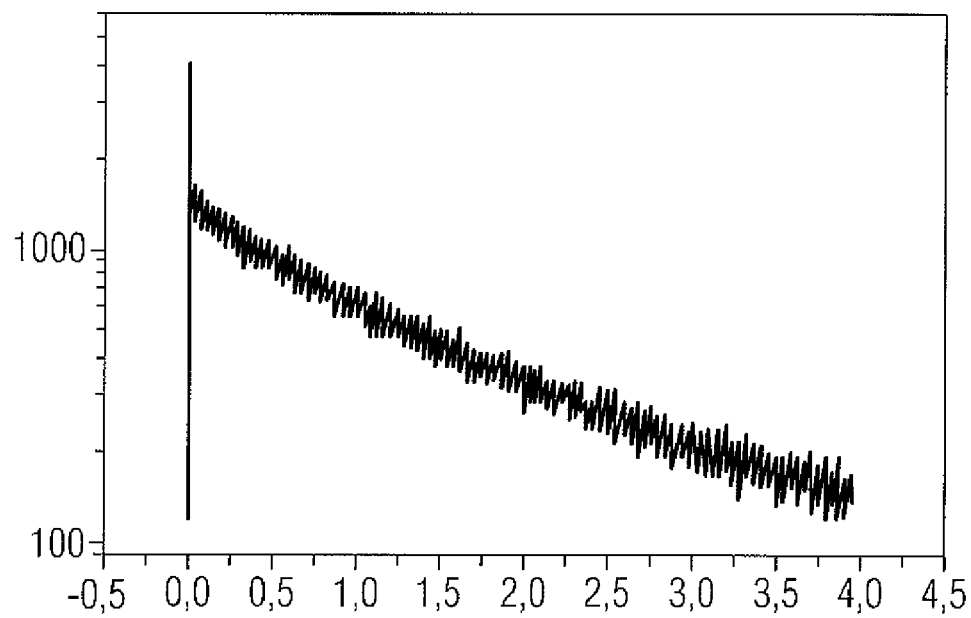

FIG. 7b shows, for a sample comprising 1% by weight of ADS 076 in PMMA, the decomposition time for the emission maximum at 595 nm. The half-life is 1.4 µs.

Figure 7C:
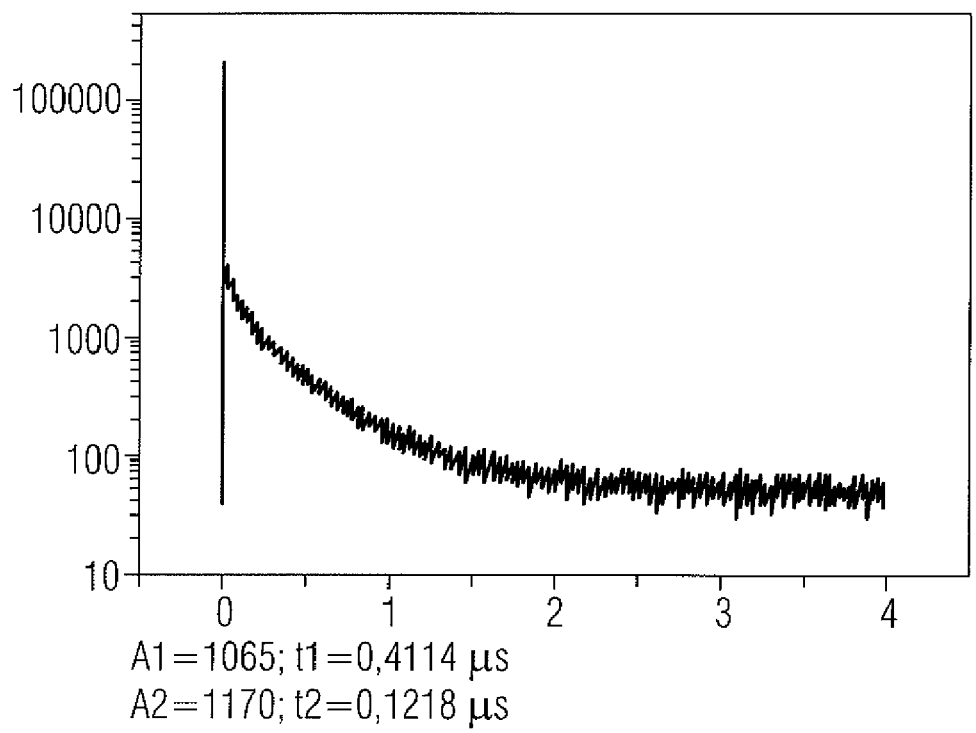
Figure 7D:
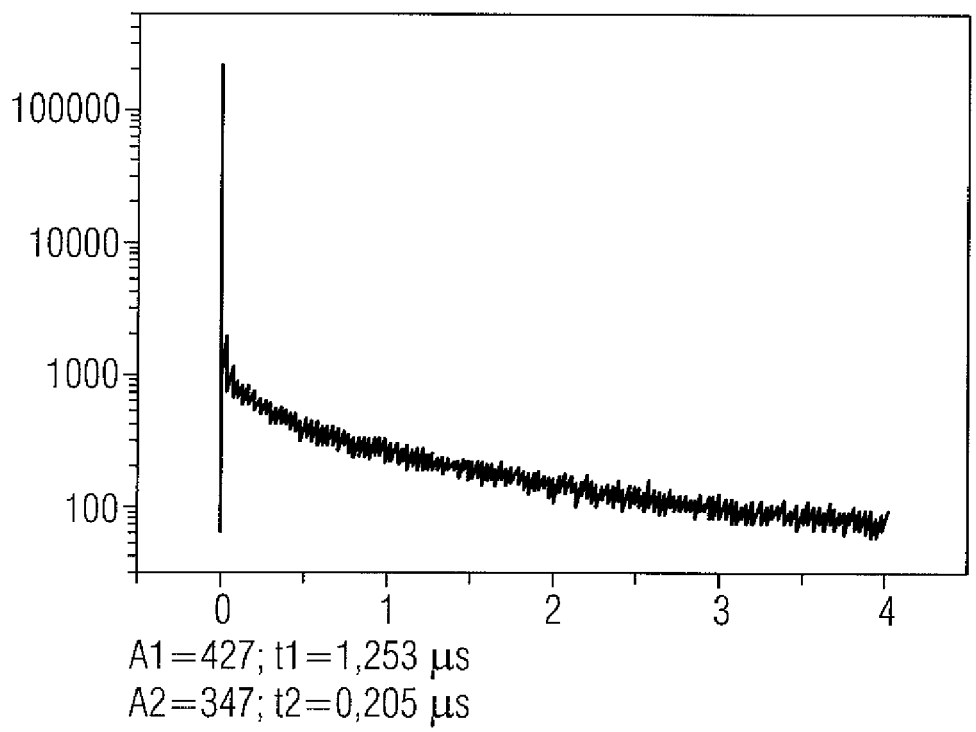

FIGS. 7c and 7d show an emitter layer comprising 1% by weight of ADS 076 and 5% by weight of Ir(ppy)₃ in PMMA. FIG. 7c shows the decomposition time for the emission maximum of the exciton scavenger at 510 nm. A half-life of 0.4 µs is found, which is only 33% of the half-life for a sample which comprises only the matrix material and the exciton scavenger.

FIG. 7d shows the spectrum for the emission maximum of ADS 076 at 595 nm; a half-life of 1.3 µsec is found here, which is barely altered compared to a sample which comprises only PMMA and ADS 076. The half-lives are measured according to V. O'Connor, D. Phillips, "Time-Correlated single photon counting" (Academic Press, London 1987).

The invention is not limited by the description with reference to the working examples. Instead, the invention encompasses any new feature and any combination of features, which especially includes any combination of features in the claims, even if this feature or this combination itself is not mentioned explicitly in the claims or working examples.

We claim:

1. A radiation-emitting device comprising:
    a substrate;
    a first electrode and a second electrode; and
    at least one emitter layer arranged between the first and second electrodes, said emitter layer comprising a matrix material, 0.5-5% by weight of a radiation emitting emitter and 5-30% by weight of a phosphorescent exciton scavenger,
    wherein the proportion by weight of said exciton scavenger is higher than that of said radiation emitting emitter,
    wherein the current efficiency of said emitter layer is increased by at least 10% compared to an emitter layer without exciton scavenger, and
    wherein the exciton scavenger has an emission maximum at a shorter wavelength than the radiation emitting emitter.

2. The radiation-emitting device according to claim 1, wherein the radiation emitting emitter is a phosphorescent emitter.

3. The radiation-emitting device according to claim 1, wherein an electron transport layer is arranged between electrode and emitter layer, and the LUMO of the exciton scavenger is lower than that of the electron transport layer.

4. The radiation-emitting device according to claim 3, wherein the difference in the emission maxima is at least 15 nm.

5. The radiation-emitting device according to claim 1, wherein the radiation emitted by the emitter layer is essentially generated by the radiation emitting emitter.

6. The radiation-emitting device according to claim 1, wherein the intensity of the normalized emission of the emission maximum of the exciton scavenger in the emitter layer is not more than 10% of the intensity of the emission maximum of the radiation emitting emitter.

7. The radiation-emitting device according to claim 1, wherein the intensity of the normalized emission of the emission maximum of the exciton scavenger in the emitter layer is not more than 10% of the normalized emission of the emission maximum of the exciton scavenger in a layer which consists of the matrix material and the exciton scavenger.

8. The radiation-emitting device according to claim 1, wherein the exciton lifetime on the radiation emitting emitter in the emitter layer is longer than on the exciton scavenger.

9. The radiation-emitting device according to claim 1, wherein the external quantum efficiency $\eta_{ext}$ of the emitter layer is increased by at least 20% compared to an emitter layer without exciton scavenger.

10. The radiation-emitting device according to claim 1, wherein the photoluminescence quantum yield of the radiation emitting emitter is greater than that of the exciton scavenger.

11. The radiation-emitting device according to claim 1, wherein the LUMO of the radiation emitting emitter is higher than that of the matrix and/or of the exciton scavenger.

12. The radiation-emitting device according to claim 1, wherein the layer thickness of the emitter layer is 10 to 40 nm.

13. The radiation-emitting device according to claim 1, having at least one further emitter layer.

14. The radiation-emitting device according to claim 13, wherein the at least one further emitter layer comprises a radiation emitting emitter and an exciton scavenger.

15. The radiation-emitting device according to claim 1, wherein an overlap of the radiation emitted by the first emitter layer and that emitted by the at least one further emitter layer results in emission of white light.

* * * * *